United States Patent [19]

Yamamoto

[11] Patent Number: 5,239,197
[45] Date of Patent: Aug. 24, 1993

[54] NON-VOLATILE MEMORY DEVICE AND TRANSISTOR CIRCUITS ON THE SAME CHIP

[75] Inventor: Masaharu Yamamoto, Otsu, Japan

[73] Assignee: Matsushita Electronics Corporation, Osaka, Japan

[21] Appl. No.: 939,853

[22] Filed: Sep. 2, 1992

Related U.S. Application Data

[63] Continuation of Ser. No. 646,864, Jan. 28, 1991, abandoned.

[30] Foreign Application Priority Data

Jan. 29, 1990 [JP] Japan ................... 2-18357

[51] Int. Cl.⁵ .............. H01L 27/02; H01L 27/04; H01L 29/68
[52] U.S. Cl. ................... 257/500; 257/491; 257/369; 257/296
[58] Field of Search ............ 357/41, 42, 43, 23.6, 357/48; 257/500, 491, 369, 296

[56] References Cited

U.S. PATENT DOCUMENTS

| | | | |
|---|---|---|---|
| 4,697,332 | 10/1987 | Joy et al. | 357/42 |
| 4,859,619 | 8/1989 | Wu et al. | 357/23.5 |
| 4,907,058 | 3/1990 | Sakai | 357/42 |

*Primary Examiner*—Rolf Hille
*Assistant Examiner*—Wael Fahmy
*Attorney, Agent, or Firm*—Ratner & Prestia

[57] ABSTRACT

This invention relates to a semiconductor device comprising an N-type semiconductor substrate, an intermediate breakdown voltage part comprised of a first P-type diffusion layer formed in the N-type semiconductor substrate, a high breakdown voltage part comprised of a second P-type diffusion layer formed in the N-type semiconductor substrate, and a transistor circuit part formed in the N-type semiconductor substrate. According to the invention, a semiconductor device capable of simultaneously forming plural functioning devices in a single semiconductor substrate, causing hardly any short channel effect, is obtained.

5 Claims, 6 Drawing Sheets

NON-VOLATILE MEMORY DEVICE AND TRANSISTOR CIRCUITS ON THE SAME CHIP

This application is a continuation of application Ser. No. 07/646,864, filed Jan. 28, 1991, now abandoned.

BACKGROUND OF THE INVENTION

The present invention relates to a semiconductor device having a nonvolatile memory device and transistors formed in one chip.

DESCRIPTION OF THE PRIOR ART

In order to enhance the functions of MOSLSI (Metal Oxide Semiconductor Large Scale Integration), recently, a method for forming various functioning elements in one chip has been developed. In order to achieve higher functions in an one-chip microcomputer, a nonvolatile memory element such as an EPROM (i.e. ultraviolet erasable, electrically programmable nonvolatile read only memory) is formed in one chip together with the microcomputer. Furthermore, it is desired to raise the breakdown voltage the driving a fluorescent display tube, and meet the needs for combining a microcomputer and memory device.

The EPROM is composed of N-channel MOS transistors formed in a P-type silicon substrate. The microcomputer is composed of complementary MOS transistors formed in an N-type silicon substrate. Accordingly, in order to mount an EPROM and a microcomputer in a single silicon substrate, it is necessary to change the manufacturing process for an EPROM after manufacturing the microcomputer circuits.

FIG. 6 shows a sectional view of a conventional semiconductor device in which high breakdown voltage devices of P-channel type are formed in P-type semiconductor substrate.

A first N-type well diffusion layer 2 is deeply diffused in a P-type silicon substrate 1, and a second N-type well diffusion layer 3 and a first P-type well diffusion layer 4, with a shallower diffusion depth than that of the N-type well diffusion layer 2, are formed. Here, ordinary transistors are formed in the second N-type well diffusion layer 3 and first P-type well diffusion layer 4, and they are collectively called a transistor circuit part.

Within the region of the first N-type well diffusion layer 2, a second P-type well diffusion layer 5 with a shallower diffusion depth than that of the first N-type well diffusion layer 2 is formed.

The write and erase circuit and boosting circuit used in the EPROM or EEPROM are composed of P-channel transistors in a third N-type well diffusion layer 6, and N-channel transistors in the P-type semiconductor substrate 1 or first P-type well diffusion layer 4. The required breakdown voltage for such an erase or boosting circuit is an intermediate voltage of about 12 to 21 volts. This breakdown voltage may be obtained relatively easily.

Continuing with the description of FIG. 6, a voltage VCC is applied to power source terminal 7. At power source terminal 8 a voltage VSS of 0 V is applied. At intermediate breakdown voltage power source terminal 9 a voltage VPN of 12 to 21 V is applied. Power source terminal 10 is the other terminal of the intermediate breakdown voltage part of voltage VSS. At high breakdown voltage power source terminal 11 a voltage of VPP −30 to −40 V is applied. Power source terminal 12 is the other power source terminal of the high breakdown voltage part of voltage VCC. Offset diffusion layer 13 is formed in a part of the high breakdown voltage part.

The P-channel type high breakdown voltage transistors for driving a fluorescent display tube or high breakdown voltage diffusion resistances are formed in the first N-type well diffusion layer 2. The operating power source is about 30 to 40 V, but considering the parasitic capacity of an external fluorescent display tube, the required breakdown voltage is about 60 V or more. Accordingly, the diffusion depth must be sufficiently promoted for properly lowering the impurity concentration of the first P-type well diffusion layer 5 and first N-type well diffusion layer 2 used as the high breakdown voltage diffusion resistances. For this purpose, heat treatment of 1200° C. for about 60 hours is necessary. Since this process takes a longtime, the throughput is lowered.

Moreover, when the microcomputer is designed on the condition of using an N-type semiconductor substrate, or when an N-type semiconductor substrate is necessary for designing a micro-computer circuit having analog circuits, it is required to modify the design so as to operate also on a P-type semiconductor substrate.

It is hence a primary object of the invention to present a semiconductor device capable of simultaneously forming plural functioning devices in a single semiconductor substrate, causing hardly any short channel effect, with high latch-up resistance. It is another object of the invention to present a reliable semiconductor device capable of raising the degree of integration of semiconductor devices and sufficiently increasing the breakdown voltage between devices, without causing malfunction during writing data to an EPROM or an EEPROM, and having a high yield from the viewpoint of breakdown voltage.

SUMMARY OF THE INVENTION

In the semiconductor device of the present invention, in order to keep the drain breakdown voltage at about 60 volts, the resistivity of the substrate is 2 to 3 ohm-cm. By using such substrate, the semiconductor device is formed in the substrate causing hardly any short channel effect. By setting the breakdown voltage at 60 volts or more, the current does not flow into the substrate when writing or erasing the non-volatile memory device. Since the breakdown voltage fluctuates depending on the dispersion in the manufacturing process, the yield may be kept high by manufacturing with a sufficient breakdown voltage margin taken into consideration.

By setting the diffusion depth of the P-type diffusion layer for forming the nonvolatile memory device at about 8 microns, the breakdown voltage between the P-type diffusion layer and the N-type diffusion layer formed in the P-type diffusion layer may be 60 V or more. As a result, the breakdown voltage between the nonvolatile memory device and other devices may be sufficiently large, and malfunction due to the writing characteristics of the nonvolatile memory device may be avoided.

Furthermore, the degree of integration may be improved by forming the N-type diffusion layer and P-type diffusion layer in mutual contact in the transistor circuit part.

As the P-type diffusion layer forming the nonvolatile memory device and the N-type diffusion layer composing the transistor circuit part are formed adjacent to each other, the manufacturing process is simple, and the degree of integration of the devices may be enhanced.

As the nonvolatile memory device formed in the P-type diffusion layer is held between the intermediate breakdown voltage part (composed of N-channel and P-channel transistors), and the high breakdown voltage part (composed of P-channel transistors), the degree of integration may be enhanced.

DESCRIPTION OF THE PREFERRED EMBODIMENTS

Figure 1:
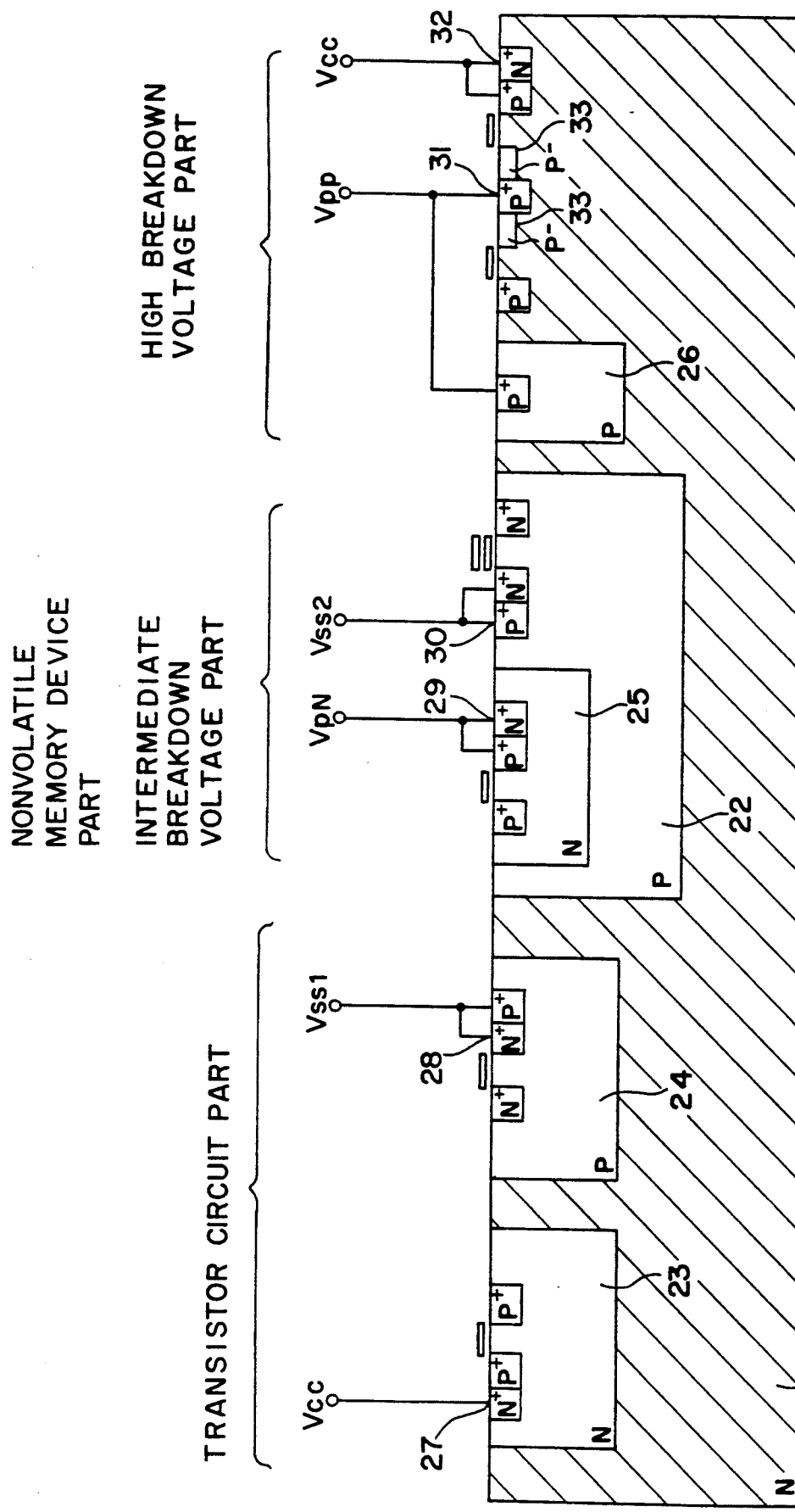
FIG. 1 is a sectional view of a first embodiment of the invention.

FIG. 1 shows a sectional view of a first embodiment of the invention.

A first P-type well diffusion layer 22 is formed in an N-type (100) silicon substrate 21, which is used as a semiconductor substrate Silicon substrate 21 has a resistivity of 2 to 3 ohm-cm.

Such resistivity is suitable for forming a P-channel high breakdown voltage transistor in N-type silicon substrate 21. In the P-channel high breakdown voltage transistor, when the specific resistivity of the substrate 21 is raised, the breakdown voltage between the drain diffusion layer and the substrate is raised advantageously, while the threshold voltage of the MOS transistor becomes lower, depending on the gate length. Thus, the so-called short channel effect is likely to occur, and it is impossible to raise the degree of integration of the semiconductor device. It is thus important, for obtaining the effect of the invention, not to raise the resistivity of the semiconductor substrate 21 too much.

In this embodiment, under the condition that the gate length of the P-channel high breakdown voltage transistor is 4 microns and the offset gate length is 4 microns, in order to obtain the drain breakdown voltage of about 60 volts, the resistivity of the substrate 21 is set at 2 to 3 ohm-cm. It is thus important to use substrate 21 with a proper resistivity in order to obtain the semiconductor device causing hardly any short channel effects with the breakdown voltage between the drain diffusion layer and substrate at not less than a desired level.

The P-type well diffusion layer 22 is formed according to the following process.

First, a thermal oxidation film of about 0.6 micron is formed on the entire surface of substrate 21, and the region for forming a first P-type well diffusion layer 22 is etched. Then, the thermal oxidation film is removed. Next, a thermal oxidation layer of about 0.04 micron is formed in the first P-type well diffusion layer 22 in which substrate 21 is exposed, so as not to cause defects in substrate 21 when implanting ions. At an acceleration energy of 50 keV, boron ions at a dose of 1 to $1.5 \times 10^{13}/cm^2$ are implanted in the region in which the first P-type well diffusion layer 22 is formed. Afterwards, heat treatment is given at 1200° C. for about 15 hours. By this heat treatment, the diffusion depth of the first P-type well diffusion layer 22 becomes about 8 microns.

In another process, a nitride film may be used on the surface of substrate 21 so that the mark used in alignment at the time of exposure may be clear.

In this other case, after growing a thermal oxidation film of about 0.05 micron on the entire surface of the substrate 21, a nitride film of about 0.12 micron is deposited. Next, after etching and removing the nitride film in the region for forming the first P-type well diffusion layer 22, ions are implanted. Leaving the nitride film, thermal oxidation is conducted at 1000° C. As a result, an insulation film, such as a LOCOS (Local Oxidation of Silicon) film, of about 0.6 micron is grown. Then, removing the nitride film, heat treatment at 1200° C. is conducted for about 15 hours in a nitrogen atmosphere. Heat treatment is performed in a nitrogen atmosphere at high temperature in the surface exposed state of substrate 21 when the thermal oxidation layer is removed by overetching (due to excessive etching time) at the time of removal of the nitride film. When heated while the surface of substrate 21 is exposed, substrate 21 is nitrided. This, in turn, may lead to deterioration of device characteristics. Accordingly, it is necessary to add the thermal oxidation process for forming a nitride layer of about 0.01 micron at 900° C. before heat treatment is started in a nitrogen atmosphere at high temperature.

Thus, when a nitride film is used for forming the P-type well diffusion layer 22, the number of process steps increases, but so does the yield, and the effect of the invention may be further enhanced.

The impurity concentration of the first P-type well diffusion layer 22 is about $2 \times 10^{16}/cm^3$. By setting such an impurity concentration, the depth of diffusion may be set at about 8 microns. Besides, the surface concentration of the second N-type well diffusion layer 25 formed in the P-type well diffusion layer 22 may be set at 2 to $3 \times 10^{16}/cm^3$, and a diffusion depth of 2.5 to 4.0 microns. In this way, in order to set the breakdown voltage between the first P-type well diffusion layer 22 and the second N-type well diffusion layer 25 to be 60 volts or more, the well diffusion layer having the above-mentioned impurity concentration is required.

In the surface region of the first P-type well diffusion layer 22, the EPROM or EEPROM circuit is formed as the nonvolatile memory device. Accordingly, in order to sufficiently increase the breakdown voltage between devices so as not to cause malfunction due to writing characteristics, an appropriate concentration of the first P-type well diffusion layer 22 is about $2 \times 10^{16}/cm^3$.

The writing circuit or erasing circuit, connected to the EPROM circuit, is formed in the second N-type well diffusion layer 25. In order to drive such circuits, an intermediate breakdown voltage of about 12 to 21 V is necessary. For this purpose it is necessary to keep a sufficient breakdown voltage between the first P-type well diffusion layer 22 and second N-type well diffusion layer 25. This requirement may be satisfied by defining the impurity concentration of the first P-type well diffusion layer 22 at about $2 \times 10^{16}/cm^3$, and the diffusion depth at about 8 microns.

A first N-type well diffusion layer 23 of which diffusion depth is shallower than that of the first P-type well diffusion layer 22 is formed at a position which is separate from the first P-type well diffusion layer 22. In addition, between the first P-type well diffusion layer 22 and the first N-type well diffusion layer 23, a second P-type well diffusion layer 24 is formed at a position which is separate from each diffusion layer.

The first N-type well diffusion layer 23 and second P-type well diffusion layer 24 are the regions in which ordinary transistors are formed, and are called, collectively, a transistor circuit part.

It is not, however, always required that the first N-type well diffusion layer 23 and the second P-type well diffusion layer 24 are separated from each other. In other words, it does not matter if the both diffusion layers 23 and 24 are in contact with each other. This is because VCC is applied to the first N-type well diffusion layer 23 through power source terminal 27. At the second P-type well diffusion layer 24, VSS is applied through power source terminal 28. The relationship of the applied voltages is VCC>VSS, and therefore, even if both diffusion layers 23 and 24 are in contact, they are respectively in reverse bias state, and leakage current does not occur.

Thus, the degree of integration may be enhanced by mutual contact of diffusion layers 23 and 24.

However, if the third P-type well diffusion layer 26 contacts the first P-type well diffusion layer 22, the device does not function normally.

Here, the impurity concentration of the second P-type well diffusion layer 24 is about $10^{16}/cm^3$. This is the concentration when the threshold voltage of the N-channel transistor is set at 0.7 V. The diffusion depth of the second P-type well diffusion layer 24 at this condition is 4 to 6 microns.

The impurity concentration of the first N-type well diffusion layer 23 is set at about $10^{18}/cm^3$. This is intended to avoid short channel effect when the threshold voltage of the P-channel transistor is set at about 0.7 V to 1.0 V.

More specifically, when forming a nonvolatile memory device, the heat treatment process at high temperature for forming the memory portion is always necessary, and hence short channel effect is likely to occur.

Accordingly, by setting the impurity concentration of the well higher, the threshold voltage is also set at a high value. The diffusion depth of the N-type well diffusion layer 23 is about 4 to 6 microns. If the diffusion depth of the N-type well diffusion layer 23 is less, it affects the latch-up resistance, and hence it is set at about 4 to 6 microns.

Furthermore, in the P-channel high breakdown voltage part, a third P-type well diffusion layer 26 is formed. This P-type well diffusion layer 26 is formed in the same process as the second P-type well diffusion layer 24.

In the well diffusion layers mentioned so far, regions of higher impurity concentration than the well diffusion layers to be used as the terminals for power source take-out are formed on the surface of substrate 21. That is, a power source terminal 27 of supply voltage VCC (5 V) is formed in the first N-type well diffusion layer 23. In the second P-type well diffusion layer 24, a power source terminal 28 of supply voltage VSS1(0V) is formed. In the third P-type well diffusion layer 26, a high breakdown voltage power source terminal 31 of VPP for applying a voltage of −30 to −40 V is formed. A power source terminal 32 of the high breakdown voltage part of supply voltage VCC is formed in substrate 21.

Inside the first P-type well diffusion layer 22, the second N-type well diffusion layer 25 is formed. In the second N-type well diffusion layer 25, a region of higher impurity concentration than that of well diffusion layer 25 is formed as power source terminal 29 in the intermediate breakdown voltage part for applying a voltage VPN of 12 to 21 V. In the first P-type well diffusion layer 22, in the surface region of substrate 21 isolated from the region of the second N-type well diffusion layer 25, a power source terminal 30 of the intermediate breakdown voltage part is formed for supplying VSS2 as the supply voltage of the first P-type well diffusion layer 22.

Accordingly, the distance between the power source terminal 30 and second N-type well diffusion layer 25 is 4 microns, and the breakdown voltage is about 60 V or more.

At this time, the distance between the power source terminal 30 and second N-type well diffusion layer 25 is necessary for keeping the breakdown voltage of the P-channel transistor and N-channel transistor which are formed in the intermediate breakdown voltage part.

The reason why the breakdown voltage is set at 60 V or more while the voltage applied at the time of driving is 12 to 21 V is to prevent flow of excessive current by keeping a sufficient breakdown voltage because a considerably large current flows in the substrate 21 at the time of writing or erasing of the nonvolatile memory device. It is hence possible to eliminate malfunctions or low reliability due to excessive current. Since the breakdown voltage fluctuates due to disparity in the manufacturing process, the yield is kept high by maintaining a sufficient margin for breakdown voltage.

In this way, the nonvolatile memory device is installed in the first P-type well diffusion layer 22, and a necessary breakdown voltage is obtained respectively.

The first N-type well diffusion layer 23 is formed by implanting phosphorus ions in the condition of 100 keV, 5 to $10 \times 10^{13}/cm^2$. The second P-type well diffusion layer 24 is formed by implanting boron ions in the condition of 50 keV, 5 to $10 \times 10^{13}/cm^2$. In each well diffusion layer, P-channel transistors are formed.

The heat treatment condition at this time is 1200° C. for about 5 hours, and the diffusion depth is 5 to 6 microns. At the same time, the third P-type well diffusion layer 26 of the P-channel high breakdown voltage part is formed.

In the third P-type well diffusion layer 26, a high breakdown voltage part of P-channel transistors is composed. The third P-type well diffusion layer 26 is used together with the high breakdown voltage P-channel transistors, and is used also as the element for pull-down resistance. In order to save the processes for forming the third P-type well diffusion layer 26, it is formed in the same process as the second P-type well diffusion layer 24. Accordingly, the impurity concentration of the third P-type well diffusion layer 26 for the P-channel transistor to possess a high breakdown voltage, the impurity concentration and diffusion depth are set in the condition so that the N-channel transistor formed in the second P-type well diffusion layer 24 may function normally.

In order to optimize the breakdown voltage and resistance value, boron ions are implanted in the later process in order to achieve the appropriate impurity concentration. This ion implantation process is conducted simultaneously with formation of the offset diffusion layer 33 formed between the gate and drain of the high breakdown voltage P-channel transistor.

The boron ion implantation condition at this time is the acceleration energy of 50 keV, and dose of about $2 \times 10^{12}/cm^2$.

In the first P-type well diffusion layer 22, the second N-type well diffusion layer 25 is formed.

In the second N-type well diffusion layer 25, a circuit composed of P-channel transistors is formed.

In the second N-type well diffusion layer 25, in the case of EPROM writing, since a voltage of about 10 to 20 V is applied, it is necessary to keep the breakdown voltage between the first P-type well diffusion layer 22 and second N-type well diffusion layer 25 at 25 V or higher.

Moreover, since the P-channel transistor circuit of the intermediate breakdown voltage part is also formed in the second N-type well diffusion layer 25, it is necessary to maintain a specified breakdown voltage for the P-type drain diffusion layer. The diffusion concentration and diffusion depth must be optimized.

Accordingly, the diffusion depth of the second N-type well diffusion layer 25 cannot be made too shallow, and a depth of about 2 to 3 microns is necessary.

Hence, the diffusion depth of the first P-type well diffusion layer 22 is appropriate at about 8 microns. This is deeper than 2 to 3 microns of the diffusion depth of the second N-type well diffusion layer 25.

The breakdown voltage between wells at this condition is 60 V or more, and a sufficient margin from the breakdown voltage in operation is set. Furthermore, in the first P-type well diffusion layer 22, N-channel nonvolatile memory device, such as an EPROM or an EEPROM, is also formed.

When writing data into the nonvolatile semiconductor device, a voltage of 12 to 21 V is applied, and a substrate current of milliampere order is flows in substrate 21.

Accordingly, it is desired to form the first P-type well diffusion layer 22 as a deep diffusion layer.

Even if a sufficient breakdown voltage is obtained, when the substrate current flows up to the vicinity of the surface, the writing characteristic of the nonvolatile memory device may be influenced. It is therefore necessary to keep the diffusion depth of the first P-type well diffusion layer 22 at about 8 microns.

When attempting to raise the breakdown voltage of the nonvolatile memory device by reducing the dose of the boron ion implantation to adjust the concentration of the first P-type well diffusion layer 22, the diffusion depth of the first P-type well diffusion layer 22 becomes shallow, and the diffusion depth of the second N-type well diffusion layer 25 is extended to lower the breakdown voltage between the wells. To prevent this, it is necessary to set the concentration of the second N-type well diffusion layer 23 at a concentration which is not too high. In this embodiment, the ion implantation into the second N-type well diffusion layer 23 is realized by implanting phosphorus ions at 100 keV, at a dose of 0.5 to $1.0 \times 10^{13}/cm^2$.

The operation of such a constructed semiconductor device is described below.

The P-channel transistor formed in the first N-type well diffusion layer 23 and the N-channel transistor formed in the second P-type well diffusion layer 24 compose ordinary transistor circuits which are driven by a supply voltage of 5 V.

In the first P-type well diffusion layer 22, a nonvolatile memory device of N-channel type, such as an EPROM or an EEPROM is formed. When writing data into the nonvolatile memory device, a voltage of 12 to 21 V is applied, and a substrate current in a milliampere order is generated in substrate 21. When the substrate current is generated, a potential gradient is produced in the P-type well diffusion layer 22. When the potential difference of the potential gradient is large, the probability of generating hot carrier becomes lowered. When the hot carrier generation probability is low, writing data into the EPROM is insufficient. Accordingly, it is necessary to pass the substrate current to the ground through substrate 21. Thus, when an EPROM is formed in the P-type well diffusion layer 22, a malfunction in writing data may occur unless the substrate current is allowed to escape from substrate 21. The substrate current generated in this way is absorbed in a sufficiently deep P-type well diffusion layer 22, and is finally taken outside substrate 21 through power source terminal 30, so that the EPROM is free from writing failure.

Meanwhile, in the P-channel transistor formed in the first N-type well diffusion layer 23 and the N-channel transistor formed in the second P-type well diffusion layer 24, large substrate current is not produced since the generated voltage is low.

When the first P-type well diffusion layer 22 and the second P-type well diffusion layer 24 are in contact with each other, an ordinary transistor circuit cannot be formed in the second P-type well diffusion layer 24 because of the following reason. This is because when both P-type well diffusion layers 22 and 24 contact each other, the second P-type well diffusion layer 24 is at the same potential as the first P-type well diffusion layer 22. Hence, the voltage of the transistor circuit formed in the second P-type well diffusion layer 24 cannot be controlled. Therefore, the transistor circuit does not present a normal circuit operation.

Figure 2:
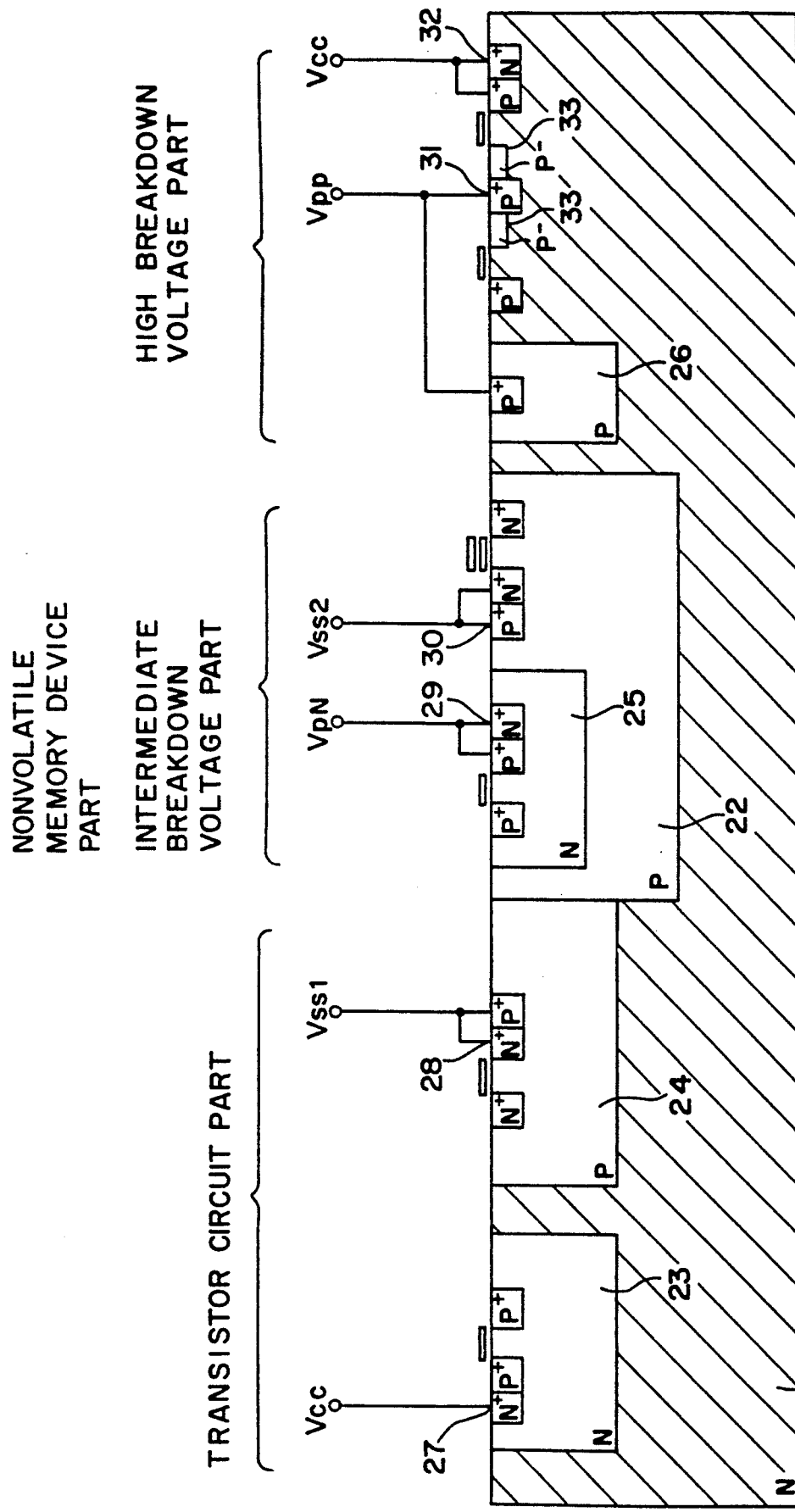
FIG. 2 is a sectional view of a second embodiment of the invention.

FIG. 2 shows a sectional view of a second embodiment of the invention.

In FIG. 2, as in the configuration of the first embodiment in which the first P-type well diffusion layer 22 and the second N-type well diffusion layer 25 are formed, an EPROM or EEPROM circuit, being a nonvolatile memory device, is formed in the surface region of the first P-type well diffusion layer 22.

A first N-type well diffusion layer 23 of which diffusion depth is shallower than that of the first P-type well diffusion layer 22 is formed at a position separate from the first P-type well diffusion layer 22. Between the first P-type well diffusion layer 22 and first N-type well diffusion layer 23, a second P-type well diffusion layer 24 is formed. The second P-type well diffusion layer 24 is formed adjacent to the first P-type well diffusion layer 22.

What is different from the first embodiment is that the first P-type well diffusion layer 22 and the second P-type well diffusion layer 24 are in contact with each other.

More specifically, a power source potential VSS1 is applied to the second P-type well diffusion layer 24 through power source terminal 28. The supply voltage VSS2, which is equal to power source potential VSS1, is similarly applied to the first P-type well diffusion layer 22 through power source terminal 30. Thus, the first and second P-type well diffusion layers 22 and 24 are at the same potential and no problem occurs if both diffusion layers are in contact.

Such a configuration simplifies the manufacturing process and enhances the degree of integration of the device.

It is not necessarily required that the first N-type well diffusion layer 23 and second P-type well diffusion layer 24 are remote from each other. In other words, it does not matter if the two diffusion layers contact each other. This is because VCC is applied to the first N-type well diffusion layer 23 through power source terminal 27. To the second P-type well diffusion layer 24, VSS1 is applied through the power source terminal 28. The applied voltages have relationship of VCC>VSS1. If both diffusion layers 23 and 24 contact with each other, it is the reverse bias state for both of them, and leakage current does not occur.

Thus, by mutual contact of the diffusion layers 23 and 24, the degree of integration may be further enhanced.

However, in this case, too, if the third P-type well diffusion layer 26 contracts with the first P-type well diffusion layer 22, it does not function normally.

Figure 3:
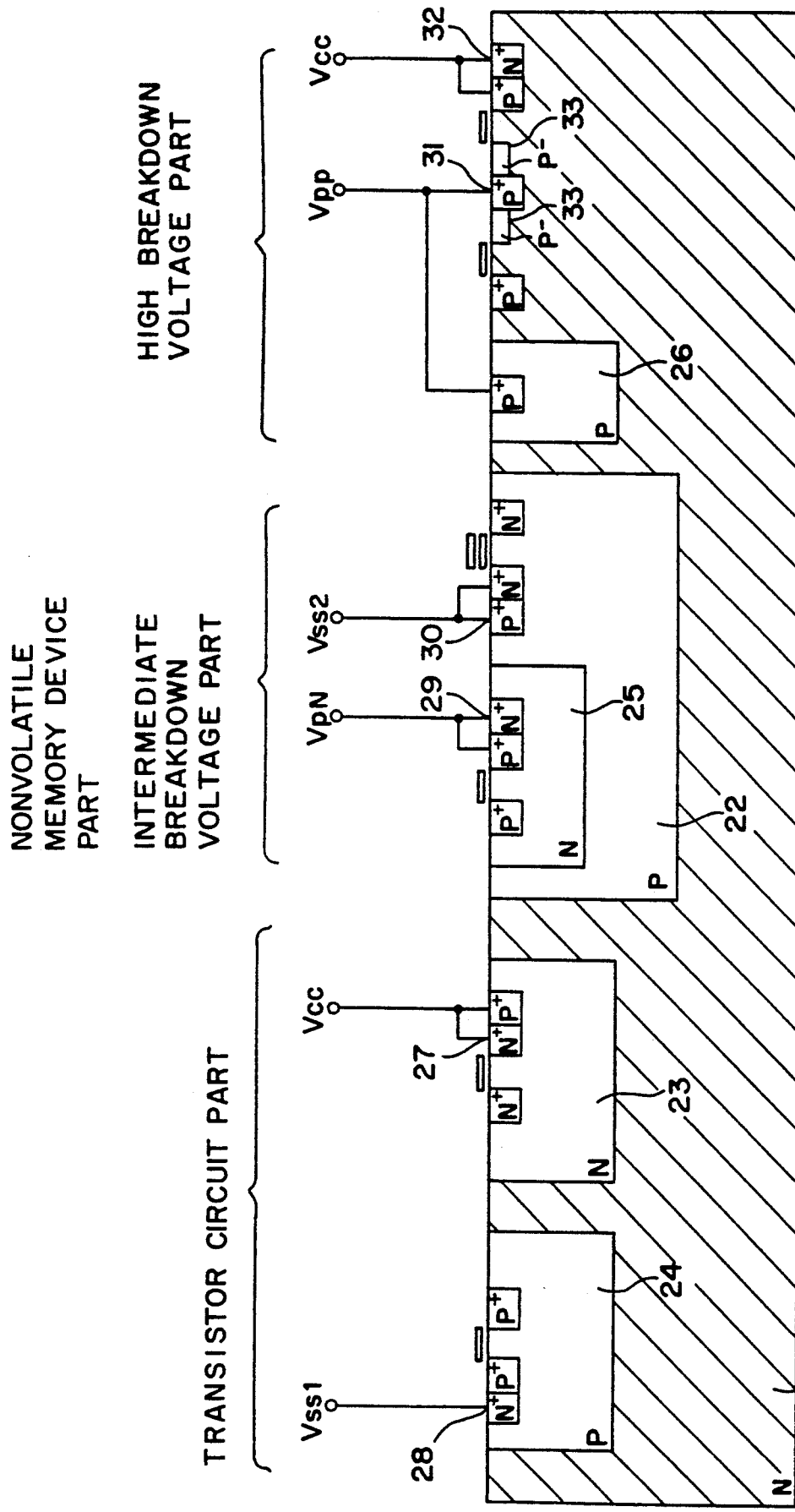
FIG. 3 is a sectional view of a third embodiment of the invention.

FIG. 3 is a sectional view of a third embodiment of the invention in detail.

In FIG. 3, as in the configuration of the first embodiment in which the first P-type well diffusion layer 22 and second N-type well diffusion layer 25 are formed, an EPROM or an EPROM circuit, being a nonvolatile memory device, is formed in the surface region of the first P-type well diffusion layer 22.

A first N-type well diffusion layer 23 of which diffusion length is shallower than that of the first P-type well diffusion layer 22 is formed opposite to the first P-type well diffusion layer 22. The first P-type well diffusion layer 22 and second P-type well diffusion layer 24 are formed at positions remote from the first P-type well diffusion layer 22 across the first N-type well diffusion layer 23. In this respect, it is different from the first embodiment.

In this case, also, it is not necessarily required that the first N-type well diffusion layer 23 and second P-type well diffusion layer 24 are remote from each other. That is, it does not matter if both diffusion layers 23 and 24 contact each other. This is because VCC is applied to the first N-type well diffusion layer 23 through power source terminal 27. VSS1 is applied to the second P-type well diffusion layer 24 through power source terminal 28. Since the applied voltages have a relationship of VCC>VSS1, both diffusion layers 23 and 24 are in reverse bias state if contacting with each other, and hence leakage current does not occur.

By such mutual contact of the diffusion layers, the degree of integration may be enhanced.

Furthermore, the first N-type well diffusion layer 23 may contact with the first P-type well diffusion layer 22. Power source potential VSS1 is applied to the second P-type well diffusion layer 24 through power source terminal 28. The supply voltage VCC is applied to the first N-type well diffusion layer 23 through power source terminal 27. Thus, well diffusion layers 22 and 23 are individually in reverse bias state, and no problem occurs if both diffusion layers contact each other.

Such a configuration simplifies the manufacturing process and enhances the degree of the integration of device.

Here, again, if the third P-type well diffusion layer 26 is in contact with the first P-type well diffusion layer 22, it does not function normally.

Figure 4:
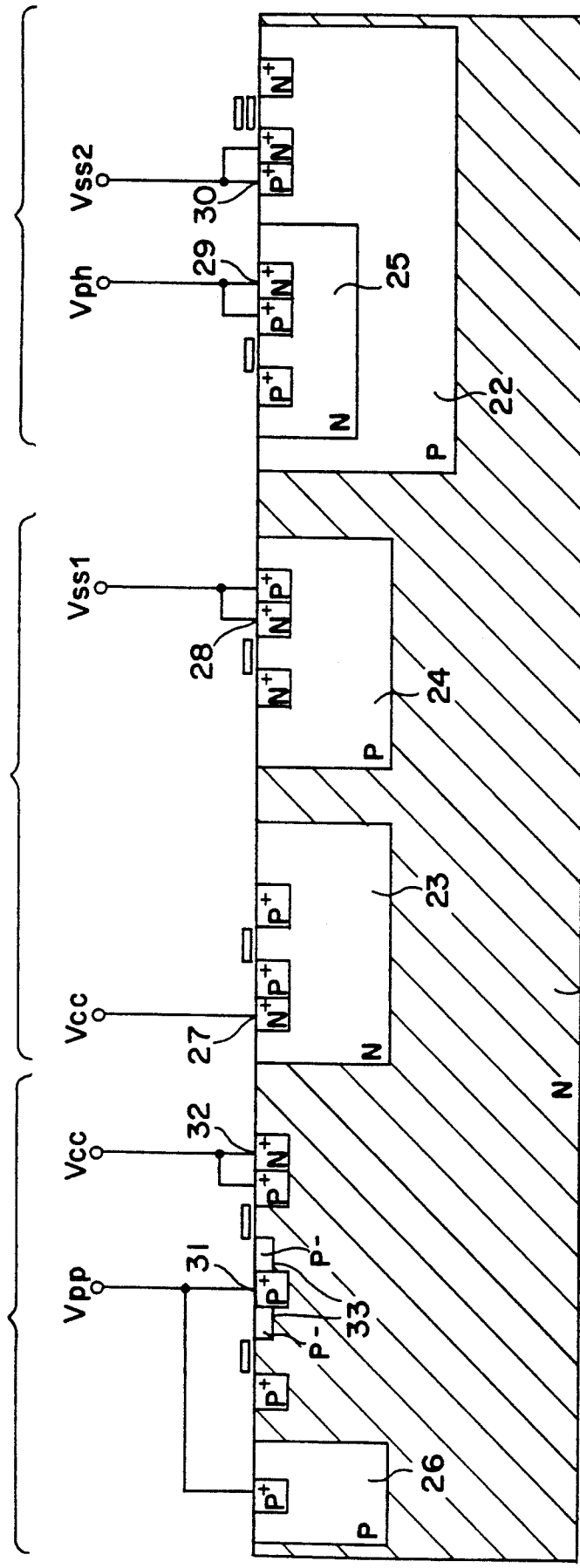
FIG. 4 is a sectional view of a fourth embodiment of the invention.

FIG. 4 shows a sectional view of a fourth embodiment of the invention in detail.

In FIG. 4, as in the configuration of the first embodiment in which the first P-type well diffusion layer 22 and second N-type well diffusion layer 25 are formed, an EPROM or EEPROM circuit, being a nonvolatile memory device, is formed in the surface region of the first P-type well diffusion layer 22.

What is different from the first embodiment is that the first N-type well diffusion layer 23 and second P-type well diffusion layer 24 are formed in the constitution comprising the nonvolatile memory device made of the first P-type well diffusion layer 22, the intermediate breakdown voltage part composed of N-channel and P-channel transistors, and the high breakdown voltage part composed of P-channel transistors.

In this case, too, the first N-type well diffusion layer 23 and the high breakdown voltage part composed of P-channel transistors may be disposed at a closer distance.

By mutual contact of the diffusion layers, the degree of integration may be enhanced.

As mentioned above, the degree of integration may be further enhanced herein also by mutual contact of the first P-type well diffusion layer 22 and second P-type well diffusion layer 24, and the second P-type well diffusion layer 24 and first N-type well diffusion layer 23.

That is, the first N-type well diffusion layer 23 may contact with the first P-type well diffusion layer 22. Power source potential VSS1 is applied to the second P-type well diffusion layer 24 through power source terminal 28. Supply voltage VCC is applied to the first N-type well diffusion layer 23 through power source terminal 27. Thus, since well diffusion layers 22 and 23 are in reverse bias state, no problem occurs if the both diffusion layers contact each other.

Figure 5:
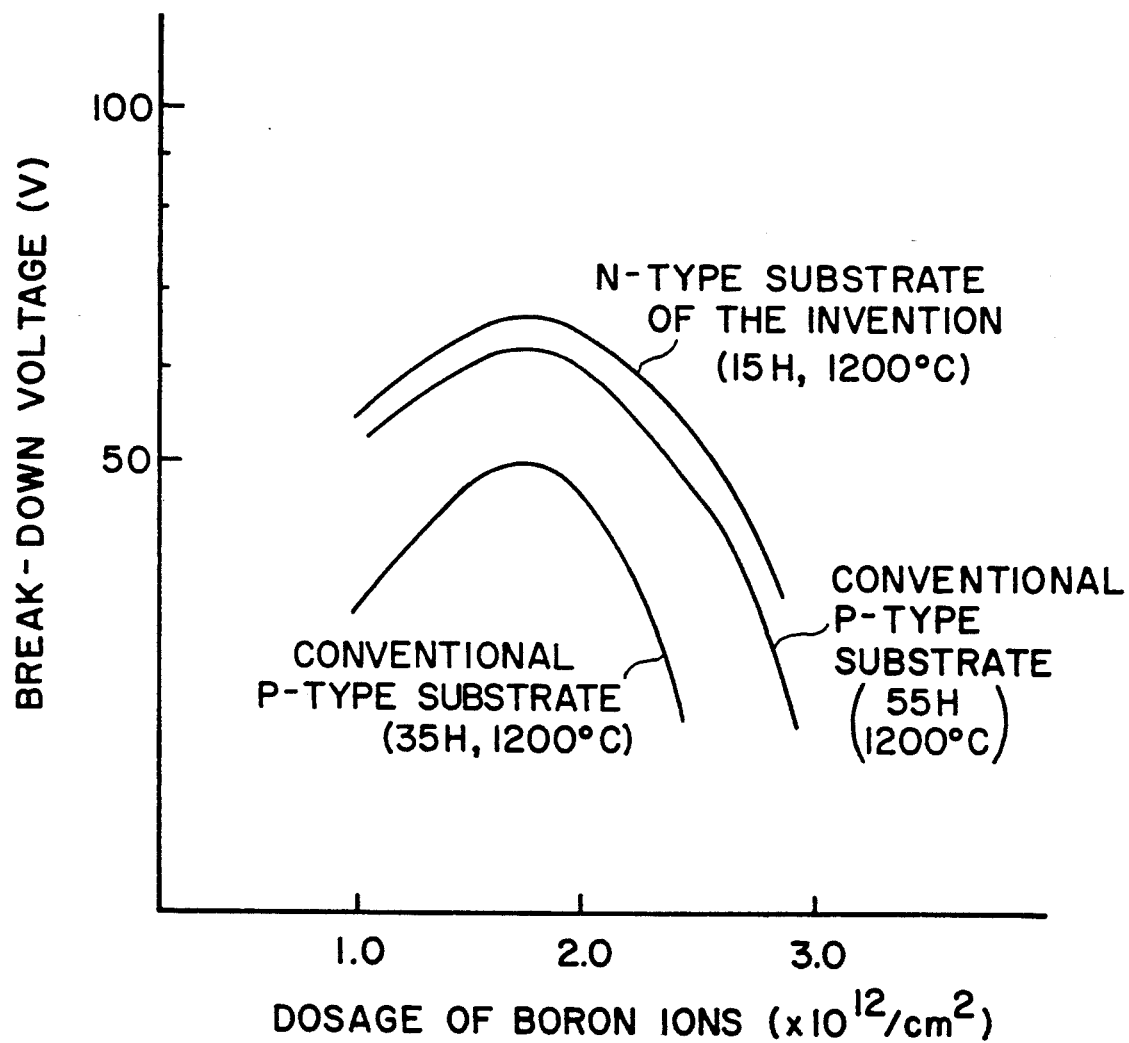
FIG. 5 is a diagram showing the relationship between the breakdown voltage and various dosages of boron ions.
Figure 6:
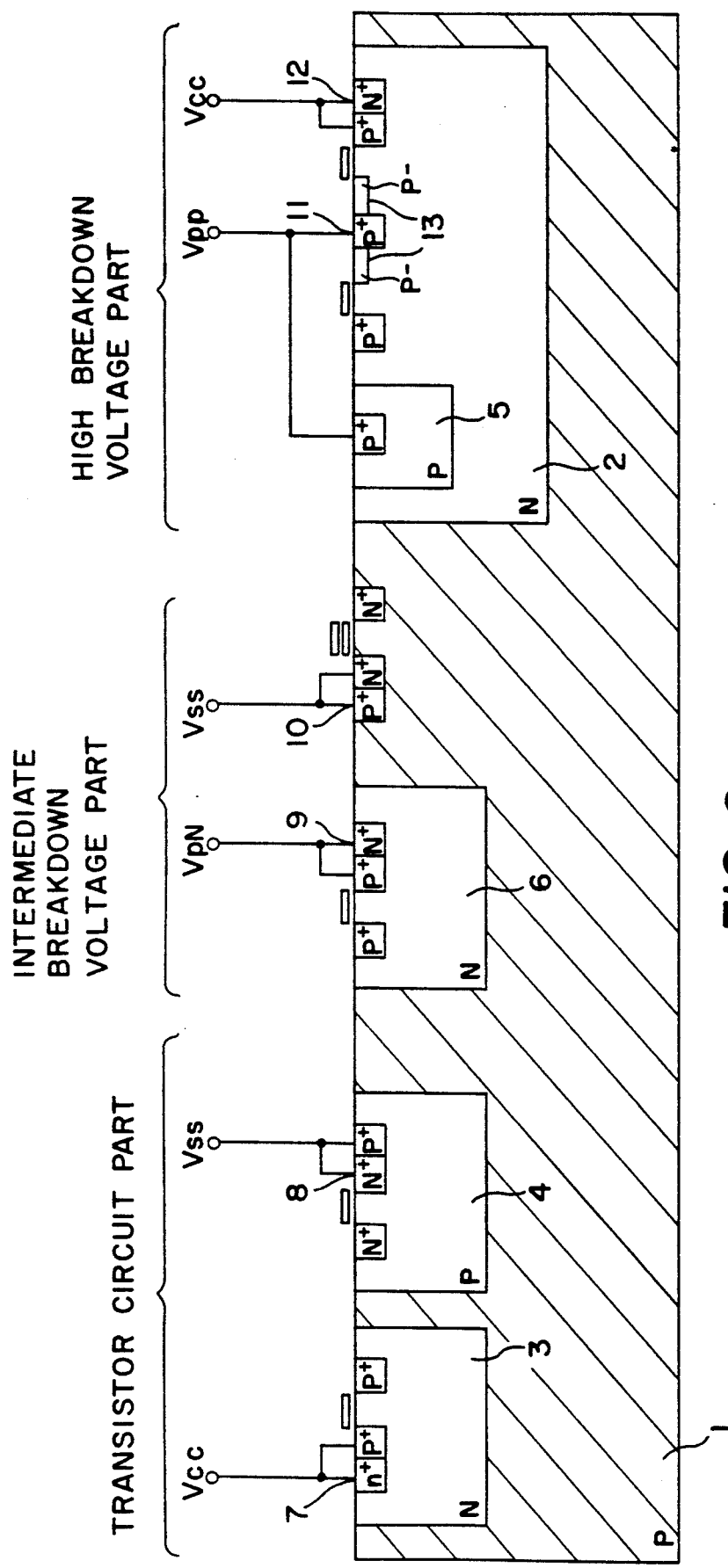
FIG. 6 is a sectional view of a prior art semiconductor device.

FIG. 5 shows the relationship between the breakdown voltage of the P-channel high breakdown voltage transistor in the P-channel high breakdown voltage part, and the dose of boron ions to the offset part.

The axis of ordinates denotes the breakdown voltage, and the axis of abscissas represents the dose of boron ions to the offset part.

It is shown in this diagram that there is an optimum value between the breakdown voltage and the dose of boron ions implanted in the offset part.

The breakdown voltage begins to decline at a dose of $2 \times 10^{12}/cm^2$ or more. It means that the breakdown including position of the device is shifted to the gate edge as the concentration of the offset diffusion layer 33 becomes higher. In other words, the resistance of the offset diffusion layer 33 becomes smaller.

Even if the dose of the boron ions in the offset part is $2 \times 10^{12}/cm^2$ or less, the breakdown voltage also begins to decline. This is because the concentration of the offset diffusion layer 33 is lowered and the concentration gradient at the drain edge becomes steep, and the electric field intensity increases in that portion, thereby inducing breakdown at the drain edge.

The optimum value of the dose of boron ions in the offset part must be selected as a dose of the boron ions at which the breakdown voltage si smaller than the maximum value. The reason for this is that if set at a dose of ions at which the breakdown voltage is near the maximum value or the breakdown voltage is over the maximum value, the gate leakage current increases abruptly, and the reliability of the device is reduced.

In FIG. 5, the N-type silicon substrate of the invention and the conventional P-type substrate are compared, by forming the deep N-type well diffusion layers at 1200° C. in 35 hours, and at 1200° C. in 55 hours.

When forming a deep well diffusion layer by using the conventional P-type substrate, in the case of heat treatment of 1200° C., 35 hours, the maximum value of the breakdown voltage is about 50 V, and in the case of 1200° C., 55 hours, the maximum value of the breakdown voltage is about 60 V. When using the N-type silicon substrate of the invention, the maximum value of the breakdown voltage is about 65 V, which is known to be higher than the breakdown voltage of the prior art.

Furthermore, the heat treatment condition of this invention is 1200° C., for about 15 hours, compared to a heat treatment time of approximately 35–55 hours in the prior art. The heat treatment time of the present invention is thus shorter than that of the prior art.

What is claimed:

1. A semiconductor device comprising:
    an N-type semiconductor substrate;
    an intermediate breakdown voltage part, said intermediate breakdown voltage part comprised of a first P-type well having a breakdown voltage and formed in said N-type semiconductor substrate;
    a high breakdown voltage part, said high breakdown voltage part comprised of a second P-type well formed in said N-type semiconductor substrate;
    and a transistor circuit part formed in said N-type semiconductor substrate;
    said first P-type well being provided with both a third N-type well and a nonvolatile memory therein, said second P-type well being provided with a transistor to drive said nonvolatile memory, and said third N-type well being provided with a circuit to write in and read from said nonvolatile memory.

2. A semiconductor device according to claim 1, wherein the depth of said first P-type well is deeper than the depth of said second P-type well and the wells to form said transistor circuit part.

3. A semiconductor device according to claim 1, wherein the voltage applied to the first P-type well, the second P-type well, the third N-type well and the transistor parts are different from each other.

4. A semiconductor device according to claim 2, wherein the depth of the first P-type well is 8 μm, and that of the third said N-type well is 2.5 to 4.0 μm.

5. A semiconductor device according to claim 1, wherein the impurity concentration of said first P-type well is $2 \times 10^{16}/cm^3$, and the impurity concentration of said third N-type well is $2 \times 10^{16}$ to $8 \times 10^{16}/cm^3$.

* * * * *